(12) United States Patent
Tiew et al.

(10) Patent No.: US 12,501,695 B2
(45) Date of Patent: Dec. 16, 2025

(54) DRIVING CIRCUIT HAVING A NEGATIVE VOLTAGE ISOLATION CIRCUIT

(71) Applicant: Monolithic Power Systems, Inc., Kirkland, WA (US)

(72) Inventors: Kee Chee Tiew, Mountain View, CA (US); Zhijiang Yang, Chengdu (CN)

(73) Assignee: Monolithic Power Systems, Inc., Kirkland, WA (US)

( * ) Notice: Subject to any disclaimer, the term of this patent is extended or adjusted under 35 U.S.C. 154(b) by 467 days.

(21) Appl. No.: 18/073,309

(22) Filed: Dec. 1, 2022

(65) Prior Publication Data
US 2024/0186322 A1 Jun. 6, 2024

(51) Int. Cl.
*H03K 17/687* (2006.01)
*H10D 84/85* (2025.01)

(52) U.S. Cl.
CPC ........... *H10D 84/85* (2025.01); *H03K 17/687* (2013.01)

(58) Field of Classification Search
CPC .. H03K 17/687; H03K 17/063; H03K 17/102; H03K 19/018557; H03K 19/00315; H03K 19/00346
See application file for complete search history.

(56) References Cited

U.S. PATENT DOCUMENTS

| | | | |
|---|---|---|---|
| 9,312,773 B2 | 4/2016 | Li | |
| 11,082,038 B1* | 8/2021 | Ross | H03K 17/687 |
| 12,283,950 B2* | 4/2025 | Chen | H04L 25/0268 |
| 2025/0088183 A1* | 3/2025 | Solomko | H03K 17/102 |
| 2025/0096794 A1* | 3/2025 | Udrea | H03K 17/687 |

* cited by examiner

*Primary Examiner* — Sibin Chen
(74) *Attorney, Agent, or Firm* — Perkins Coie LLP

(57) ABSTRACT

A driving circuit for a power transistor. The driving circuit has a control pin to receive a control signal, a driving pin to provide a driving signal to control the power transistor, the driving signal is generated based on the control signal. The driving circuit also has a negative voltage isolation circuit connected between an isolation pin and an output pin, when the voltage at the output pin is greater than an isolation voltage, the voltage at the isolation pin is equal to the voltage at the output pin, and when the voltage at the output pin is less than the isolation voltage, the voltage at the isolation pin is clamped at a preset voltage value, the preset voltage value is in a range from −2V to −0.2V.

17 Claims, 5 Drawing Sheets

DRIVING CIRCUIT HAVING A NEGATIVE VOLTAGE ISOLATION CIRCUIT

TECHNICAL FIELD

This disclosure generally relates to a driving circuit, and more particularly but not exclusively relates to a driving circuit used for an N-type power transistor.

BACKGROUND OF THE INVENTION

For a driving circuit used for an N-type power transistor, the driving circuit has an input pin coupled to the drain terminal of the N-type power transistor and an output pin coupled to the source terminal of the N-type power transistor. The driving circuit also has a driving pin that provides a driving signal to the gate terminal of the N-type power transistor to control the N-type power transistor. The driving circuit also has a bootstrap capacitor coupled between the output pin and a bootstrap pin to level shift the driving signal. For the driving circuit, when the N-type power transistor is turned on, the voltage at the output pin is equal to the voltage at the input pin, and when the N-type power transistor is turned off, the voltage at the output pin may go to a very high negative voltage value. In some applications, the voltage at the output pin may be as low as about −100V. Due to the coupling effect of the bootstrap capacitor, the voltage at the bootstrap pin may follow the voltage at the out pin, and may also go to −100V. In the driving circuit, the internal circuits connected to the bootstrap pin may have a work voltage that may as high as VIN or as low as −100V, so the internal circuits are required to have a breakdown voltage greater than VIN+100V. The high breakdown voltage requirement increases the fabrication cost of the driving circuit.

Therefore, there is a need for a driving circuit that can drive an N-type power transistor with a relative low breakdown voltage requirement.

SUMMARY OF THE INVENTION

In accomplishing the above and other objects, the present invention provides a driving circuit for a power transistor. The driving transistor comprises a control pin configured to receive a control signal, a driving pin configured to provide a driving signal, wherein the driving signal is generated based on the control signal, and a negative voltage isolation circuit coupled between an isolation pin and an output pin. The negative voltage isolation circuit comprises an isolation device, wherein the isolation device has a first terminal coupled to the isolation pin, and a second terminal coupled to the output pin, wherein when the voltage at the output pin is greater than an isolation voltage, the voltage at the isolation pin is equal to the voltage at the output pin, and wherein when the voltage at the output pin is less than the isolation voltage, the voltage at the isolation pin is clamped at a preset voltage value, the preset voltage value is in a range from −2V to −0.2V.

In accomplishing the above and other objects, the present invention provides a switching circuit. The switching circuit comprises a power transistor having a source terminal, a drain terminal and a gate terminal, an input pin coupled to the source terminal of the power transistor, an output pin coupled to the drain terminal of the power transistor, a control pin configured to receive a control signal, a driving pin coupled to the gate terminal of the power transistor and configured to provide a driving signal to control the power transistor, wherein the driving signal is generated based on the control signal. The switching circuit further comprises a bootstrap pin coupled to a first terminal of a bootstrap capacitor, an isolation pin coupled to the second terminal of the bootstrap capacitor; and a negative voltage isolation circuit, coupled between the isolation pin and the output pin, wherein when the voltage at the output pin is greater than the isolation voltage, the voltage at the isolation pin is equal to the voltage at the output pin, and when the voltage at the output pin is less than the isolation voltage, the voltage at the isolation pin is clamped at a preset voltage value, the preset voltage value is in a range from −2V to −0.2V.

BRIEF DESCRIPTION OF DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION OF THE INVENTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in an embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
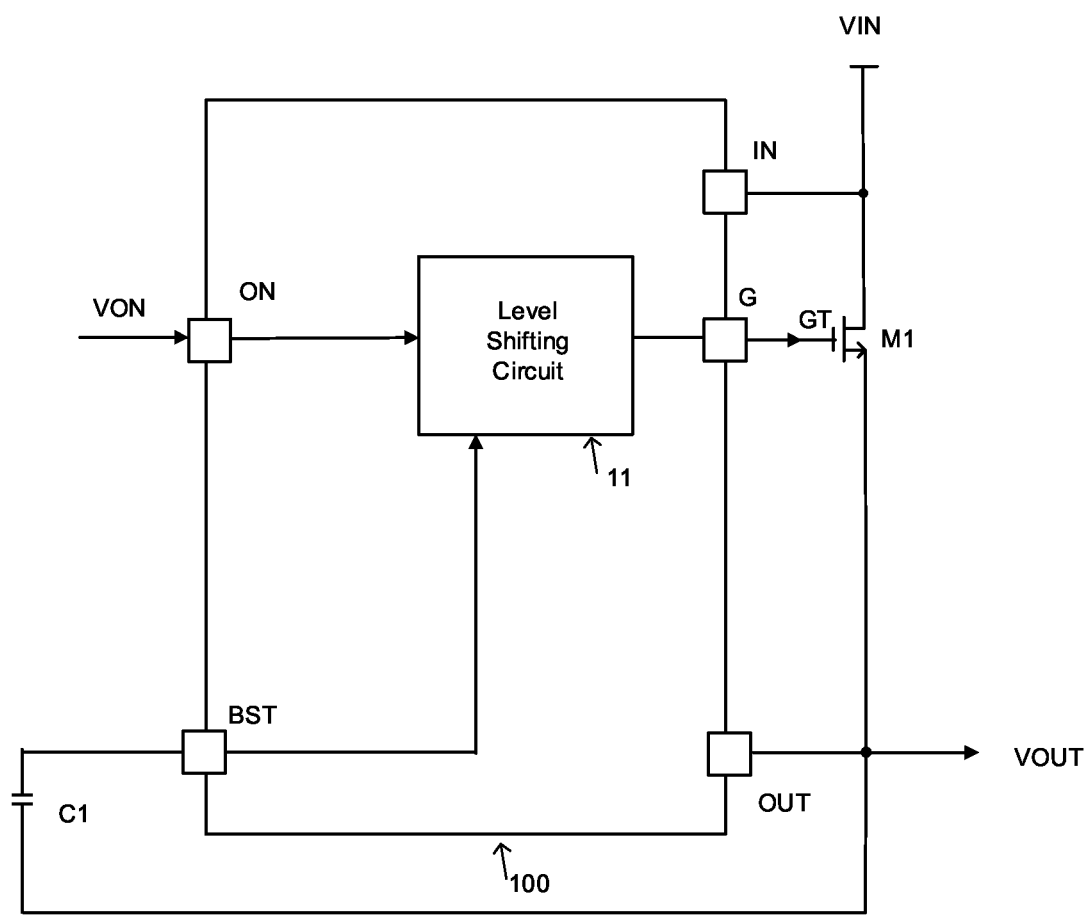
FIG. 1 illustrates a block diagram of a prior art driving circuit 100 and a power transistor M1.

FIG. 1 illustrates a block diagram of a prior art driving circuit 100 and a power transistor M1. As shown in FIG. 1, the driving circuit 100 has an input pin IN, an output pin OUT, and a driving pin G. The input pin IN is coupled to the drain terminal of the power transistor M1 to receive an input voltage VIN, the output pin OUT is coupled to the source terminal of the power transistor M1 and configured to provide an output voltage VOUT. The driving pin G is coupled to the gate terminal of the power transistor M1 and configured to provide a driving signal GT to control the power transistor M1. The driving circuit 100 also has a control pin ON, a bootstrap pin BST, and a level shifting circuit 11, wherein the control pin ON is configured to receive a control signal VON, the level shifting circuit 11 has an input terminal coupled to the control pin ON to receive the control signal VON and an output terminal coupled to the driving pin G to provide the driving signal GT, and wherein the driving signal GT is generated based on the control signal VON. The control signal VON has a logic high state and a logic low state and when the control signal VON is at the logic high state, the power transistor M1 is turned on by the driving signal GT, and when the control signal VON is at the logic low state, the power transistor M1 is turned off by the driving signal GT. In some applications, when the power transistor M1 is turned off, the voltage at the output pin OUT, i.e., the output voltage VOUT may go to a relative low negative voltage value, for example, the voltage at the output pin OUT may go to a negative voltage value of −100V. The bootstrap pin BST is connected to the output pin OUT via a bootstrap capacitor C1, so the voltage at the bootstrap pin BST may follow the voltage at the output pin OUT to −100V, thus the internal circuits coupled to the bootstrap pin BST are required to support a maximum voltage value as high as the input voltage VIN and a minimum voltage value as low as −100V. For example, if the input voltage VIN is 80V, and the output pin OUT has a minimum voltage value of −100V, so the level shifting circuit 11 has to work both in 80V and −100V, thus devices in the level shifting circuit 11 needs to have a breakdown voltage as high as 180V in order to achieve a reliable and safe work. The fabrication cost of the driving circuit is increased if its devices are required to have a higher breakdown voltage, so a driving circuit with the bootstrap pin BST not following the voltage at the output pin OUT to a relative low negative voltage value is required.

Figure 2:
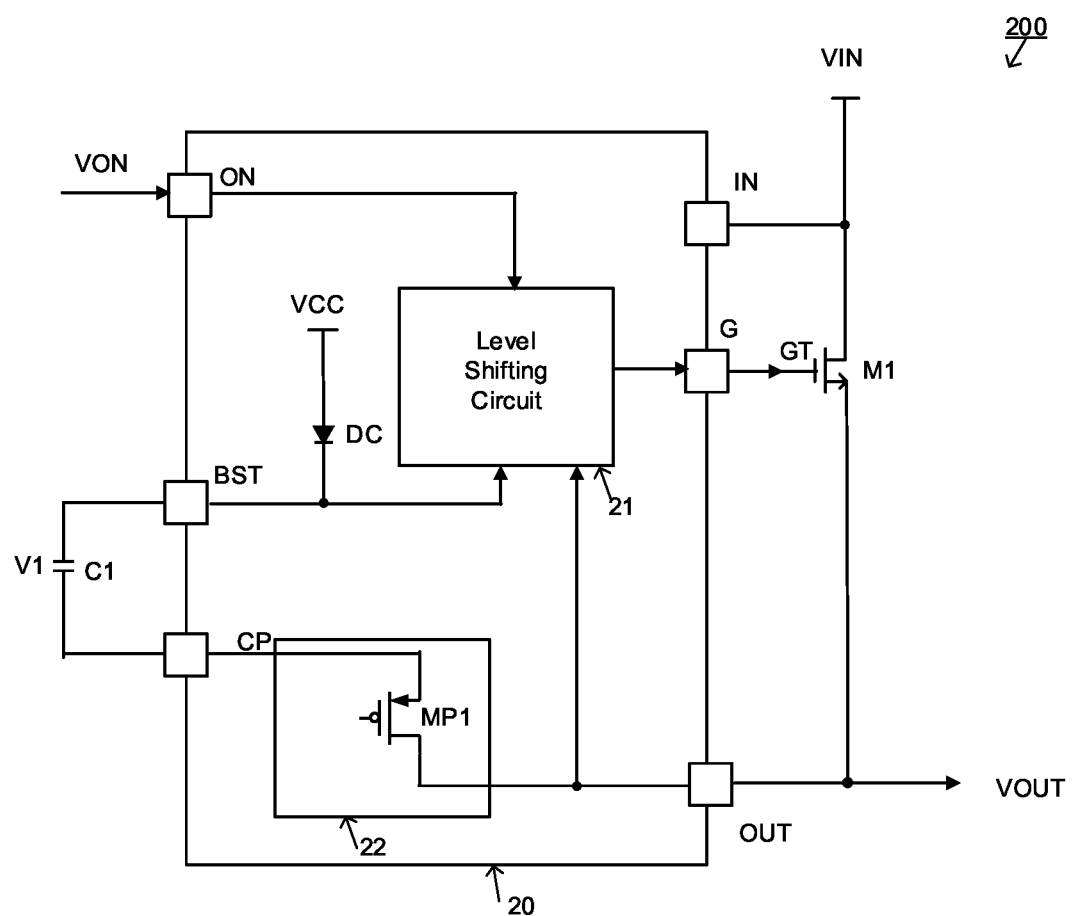
FIG. 2 illustrates a schematic diagram of a switching circuit 200 according to an embodiment of the present invention.

FIG. 2 illustrates a schematic diagram of a switching circuit 200 according to an embodiment of the present invention. In the embodiment shown in FIG. 2, the switching circuit 200 comprises a driving circuit 20 and a power transistor M1. The driving circuit 20 has an input pin IN, a driving pin G configured to provide a driving signal GT, and an output pin OUT. Wherein the input pin IN is coupled to the drain terminal of the power transistor M1 and is configured to receive an input voltage VIN, the output pin OUT is coupled to the drain terminal of the power transistor M1 and is configured to provide an output voltage VOUT. The driving circuit 20 also comprises a control pin ON configured to receive a control signal VON, a bootstrap pin BST, an isolation pin CP and a level shifting circuit 21. In the embodiment of FIG. 2, a bootstrap capacitor C1 is coupled between the bootstrap pin BST and the isolation pin CP.

In the embodiment of FIG. 2, the level shifting circuit 21 is coupled to the control pin ON to receive the control signal VON and is configured to generate the driving signal GT based on the control signal VON. Wherein the control signal VON has a logic low state and a logic high state, while the driving signal GT also has a logic low state and a logic high state. Wherein when the control signal VON is at its logic low state, the driving signal GT is at its logic low state, and the power transistor M1 is turned off, and when the control signal VON is at its logic high state, the driving signal GT is at its logic high state, and the power transistor M1 is turned on. In an embodiment, the control signal VON has its logic low state equaling to a reference ground and a logic high state in a range from 3V to 6V. In an embodiment, the control signal VON has its logic high state of 5V. The driving signal GT has its logic low state equaling to the voltage at the output pin OUT, and its logic high state equaling to the voltage at the bootstrap pin BST. In the embodiment shown in FIG. 2, the power transistor M1 is an N-type field effect transistor.

The driving circuit 20 further comprises a negative voltage isolation circuit 22 coupled between the isolation pin CP and the output pin OUT, wherein when the voltage at the output pin OUT is greater than an isolation voltage VN, the voltage at the isolation pin CP is equal to the voltage at the output pin OUT, and when the voltage at the output pin OUT is less than the isolation voltage VN, the voltage at the isolation pin CP is clamped at a preset voltage value, the preset voltage value is in a range form −2V to −0.2V. In one embodiment, the isolation voltage VN is in a range from 0.3V and 2V. In an embodiment, the negative voltage isolation circuit 22 comprises an isolation device coupled between the isolation pin CP and the output pin OUT, wherein when the voltage at the output pin OUT is greater than the isolation voltage VN, the isolation device is turned on, and when the voltage at the output pin OUT is less than the isolation voltage VN, the isolation device is turned off. In the embodiment of FIG. 2, the isolation device is a P-type field effect transistor (PFET) MP1, and the source terminal of the PFET MP1 is coupled to the isolation pin CP, the drain terminal of the PFET MP1 is coupled to the output pin OUT.

In FIG. 2, the driving circuit 20 also comprises a bootstrap diode DC, which is configured to work together with the bootstrap capacitor C1 as a charging pump circuit. The working principle of the charging pump circuit is: when the driving signal GT is at its logic low state, the power transistor M1 is turned off, the voltage at the output pin OUT can be equal to the reference ground or a negative voltage value depending on the specific application condition, the voltage at the isolation pin CP is clamped at the preset voltage value, the bootstrap capacitor C1 is charged by an internal power supply VCC through the bootstrap diode DC, so that the bootstrap capacitor C1 has a charging voltage V1. When the driving signal GT is at its logic high state, the power transistor M1 is turned on and the voltage at the output pin OUT is equal to the input voltage VIN, the voltage at the isolation pin CP is equal to the voltage at the output pin OUT for the isolation device MP1 is turned on, the voltage at the bootstrap pin BST is equal to the input voltage VIN plus the charging voltage V1. In a word, by the charging pump circuit, the voltage at the bootstrap pin BST is always equal to the voltage at the isolation pin CP plus the charging voltage V1. The bootstrap diode DC in FIG. 2 is only an example schematic used to illustrate function of the charging pump circuit, and all circuits with the above-mentioned charging pump circuit function are suitable to the present invention.

Figure 3:
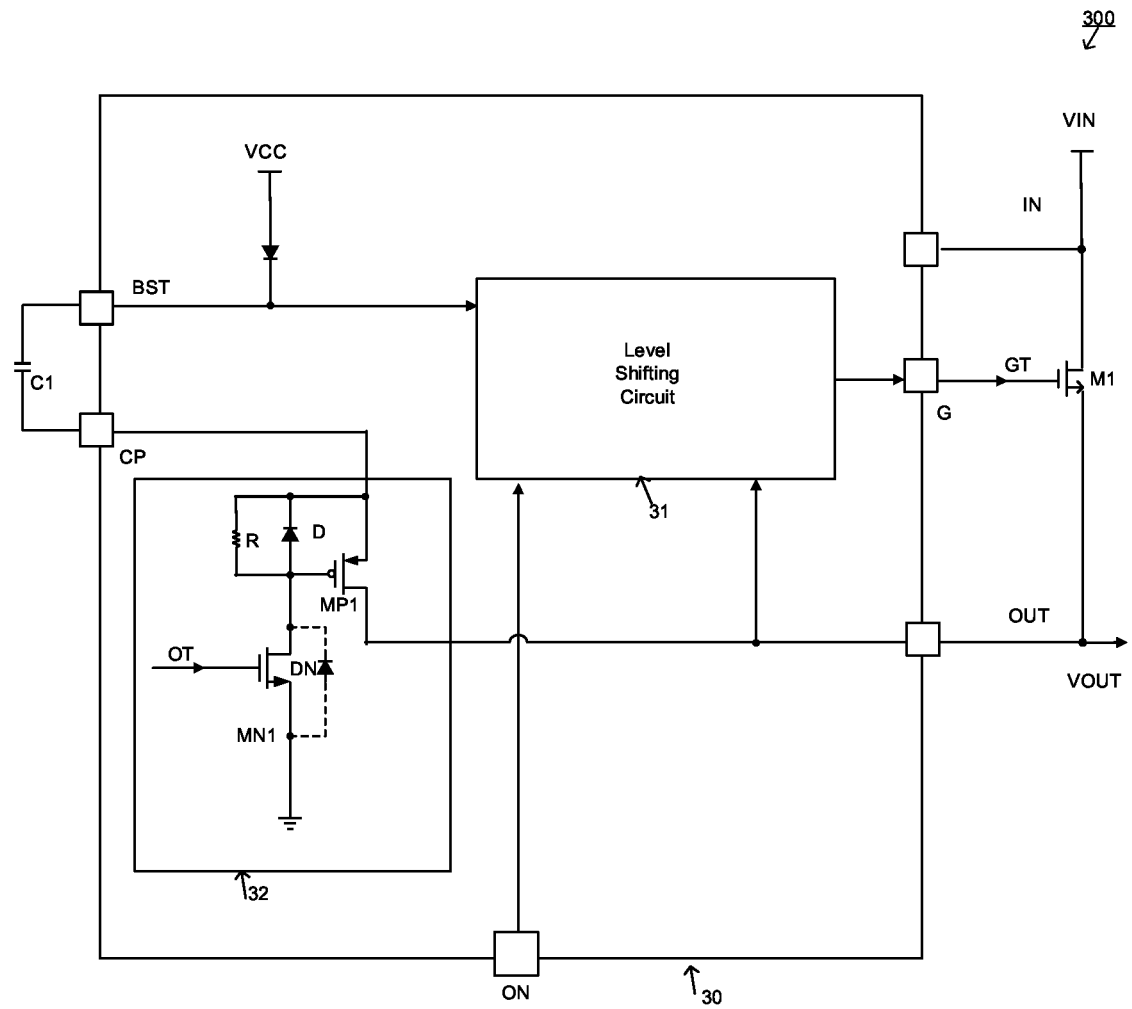
FIG. 3 illustrates a specific schematic diagram of a switching circuit 300 according to an embodiment of the present invention FIG. 3.

FIG. 3 illustrates a specific schematic diagram of a switching circuit 300 according to an embodiment of the present invention. In the embodiment shown in FIG. 3, the switching circuit 300 comprises a driving circuit 30 and a power transistor M1. The driving circuit 30 has a level shifting circuit 31 and a negative voltage isolation circuit 32, wherein the negative voltage isolation circuit 32 comprises a P-type field effect transistor MP1, an isolation resistor R and a zener diode D. The isolation resistor R is coupled between the source terminal and gate terminal of the P-type field effect transistor MP1. The anode of the zener diode D is coupled to the gate terminal of the P-type field effect transistor MP1, and the cathode of the zener diode D is coupled to the source terminal of the P-type field effect transistor MP1. The negative voltage isolation circuit 32 further comprises a pull-down transistor MN1, the source terminal of the pull-down transistor MN1 is coupled to a reference ground, the drain terminal of the pull-down transistor MN1 is coupled to the gate terminal of the P-type field effect transistor MP1, the gate terminal of the pull-down transistor MN1 is configured to receive an isolation control signal OT1, it should be understand that the pull-down transistor MN1 has a natural parasitic body diode DN between its source terminal and its drain terminal. The negative voltage isolation circuit 32 working principle is illustrated as below with a detailed description, when the control signal VON transits from its logic high state to its logic low state, the driving signal GT also transits from its logic high state to its logic low state to turn off the power transistor M1 accordingly, then the voltage at the output pin OUT is decreased from the input voltage VIN. when the voltage at the output pin OUT is greater than the isolation voltage VN, the pull-down transistor MN1 is turned on, and a current flows from the isolation pin CP through the isolation resistor R and the pull-down transistor MN1 to the reference ground. The voltage on the isolation resistor R is greater than the threshold voltage of the P-type field effect transistor MP1 (the threshold voltage of an typical P-type field effect transistor is usually about 0.7V), the P-type field effect transistor MP1 is turned on, and the voltage at the isolation pin CP is equal to the voltage at the output pin OUT. When the voltage at the output pin OUT is decreased to be equal to the isolation voltage VN, then the P-type field effect transistor MP1 is turned off. In an embodiment, the isolation voltage VN is in a range from 0.3V to 2V. In another embodiment, the isolation voltage VN is in a range from 0.6V to 1V. In the embodiment shown in FIG. 3, the isolation voltage VN is equal to the threshold voltage of P-type field effect transistor MP1, i.e., about 0.7V. When the voltage at the output pin OUT is decreased from the isolation voltage VN to a relative low negative voltage value (for example −100V), the voltage at the isolation pin CP is would like to decreased with the output pin OUT for couple function of the parasitic capacitor between the output pin OUT and the isolation pin CP. However, the existing of the patristic body diode DN of the MN1, the voltage at the isolation pin CP is clamped at a preset voltage value, the preset voltage value is in a range from −2V to −0.2V. In an embodiment, the preset voltage value is in a range from −1V to −0.4V. In the embodiment shown in FIG. 3, the preset voltage value is equal to the forward conductive voltage of the parasitic diode DN, which is usually around −0.7V.

Figure 4:
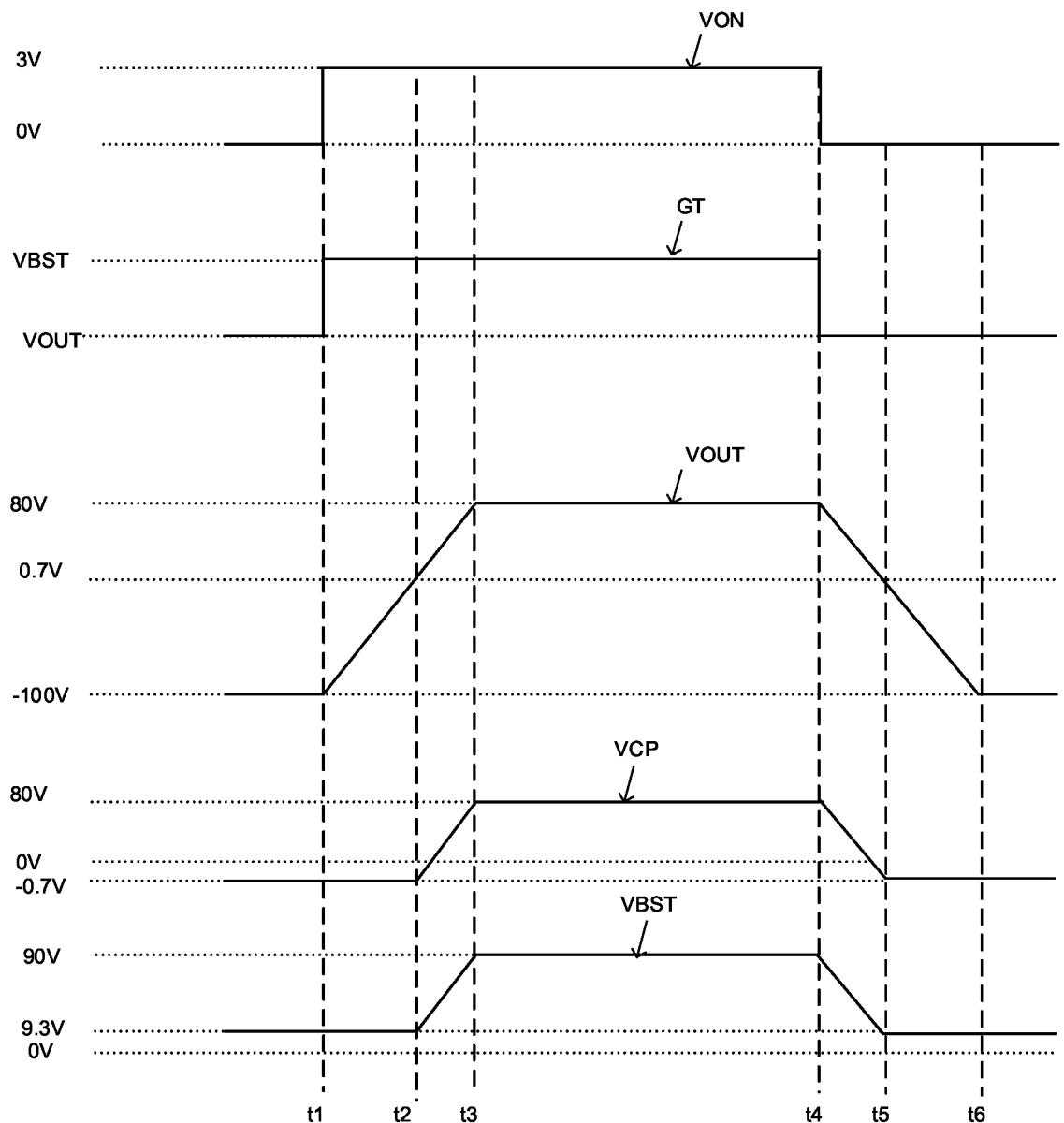
FIG. 4 illustrates a waveform diagram of each signal in the switching circuit 300 shown in FIG. 3 according to an embodiment of the present invention.

FIG. 4 illustrates a waveform diagram of each signal in the switching circuit 300 shown in FIG. 3 according to an embodiment of the present invention. FIG. 4 illustrates the waveforms of the control signal VON, the driving signal GT, the voltage at the output pin OUT (VOUT), the voltage at the isolation pin VP (VCP), and the voltage at the bootstrap pin BST (VBST), respectively. The waveforms of each signal in FIG. 4 are described below with reference to FIG. 3, wherein assumed that, the input voltage VIN is 80V, the control signal VON has its logic high state of 3V and its logic low state of 0V, the voltage at the output pin OUT (VOUT) has its minimum voltage value of −100V, and the charging voltage V1 is 10V. At moment t1, the control signal VON transits from the logic low state to the logic high state, the driving signal GT also transits from its logic low state to its logic high state to turn on the power transistor M1 accordingly. The voltage at the output pin OUT (VOUT) increases from the minimum voltage value of −100V. At moment t2, the voltage at the output pin OUT (VOUT) rises to the isolation voltage VN (about 0.7V for the exemplary embodiment of the switching circuit 300). From moment t1 to moment t2, the voltage at the output pin OUT (VOUT) is less than the isolation voltage VN, so the voltage at the isolation pin CP (VCP) is clamped at a preset voltage value (about −0.7V in the exemplary embodiment of the switching circuit 300). From moment t2 to moment t3, the voltage at the output pin OUT (VOUT) rises from the isolation voltage VN to 80V. After moment t3, because the voltage at the output pin OUT (VOUT) is greater than the isolation voltage VN, the isolation device MP1 is turned on and the voltage at the isolation pin CP (VCP) follows with the voltage at the output pin OUT (VOUT), so in the period from moment t3 to moment 4, the voltage at the isolation pin CP (VCP) is equal to the voltage at the output pin OUT (VOUT). At moment t4, the control signal VON transits from the logic high state to the logic low state, then the driving signal GT also transits from the logic high state to the logic low state accordingly, so the voltage at the output pin OUT (VOUT) decreases from 80V. At moment t5, when the voltage at the output pin OUT (VOUT) decreases to the isolation voltage VN (VN=0.7V in the switching circuit 300). From moment t4 to moment t5, the voltage at the output pin OUT (VOUT) is greater than the isolation voltage VN, so the voltage at the isolation pin CP (VCP) is equal to the voltage at the output pin OUT (VOUT). From moment t5 to moment t6, the voltage at the output pin OUT (VOUT) decreases from the isolation voltage VN (VN=0.7V) to −100V, and the voltage at the isolation pin CP (VCP) is clamped again at the preset voltage value. In FIG. 4, from moment t1 to moment t6, the voltage at the bootstrap pin BST (VBST) is always equal to the voltage at the isolation pin CP (VCP) plus the charging voltage V1.

Figure 5:
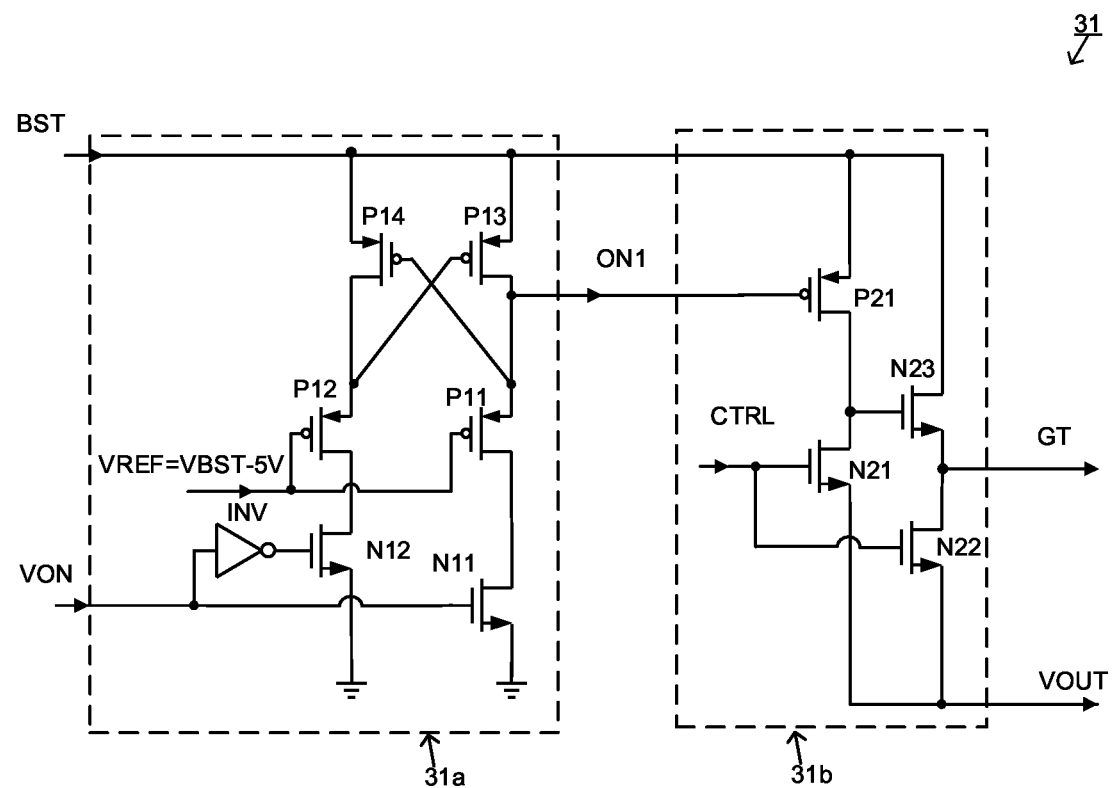
FIG. 5 illustrates a specific circuit structure diagram of a level shifting circuit 31 according to an embodiment of the present invention.

FIG. 5 illustrates a specific circuit structure diagram of a level shifting circuit 31 according to an embodiment of the present invention. In FIG. 5, the level shifting circuit 31 comprises a first-order shifting circuit 31a and a second-order shifting circuit 31b, wherein the first-order shifting circuit 31a has an input terminal coupled to the control terminal ON to receive the control signal VON and an output terminal to output a first-order shifting signal ON1. The second-order shifting circuit 31b has an input terminal to receive the first-order shifting signal ON1 and an output terminal coupled to the driving pin G to output the driving signal GT. In FIG. 5, the first-order shifting circuit 31a comprises a first N-type field effect transistor N11, a second N-type field effect transistor N12, a first P-type field effect transistor P11, a second P-type field effect transistor P12, a third P-type field effect transistor P13, a fourth P-type field effect transistor P14, and an inverter INV. The inverter INV has an input terminal and an output terminal, wherein the input terminal is configured to receive the control signal VON and the output terminal is coupled to the gate terminal of the second N-type field transistor N12. The source terminal of the first N-type field effect transistor N11 is coupled to the reference ground and the gate terminal is coupled to the control pin ON to receive the control signal VON. The source terminal of the second N-type field effect transistor N12 is coupled to the reference ground. The gate terminal of the first P-type field effect transistor P11 is configured to receive a reference voltage VREF. In the embodiment of FIG. 5, the reference voltage VREF is equal to the voltage at the bootstrap pin BST (VBST) minus 5V. In one embodiment, the reference voltage VREF may be equal to the voltage at the bootstrap pin BST (VBST) minus 3V. The drain terminal of the first P-type field effect transistor P11 is coupled to the drain terminal of the first N-type field effect transistor N11. The source terminal of the third P-type field effect transistor P13 is coupled to the bootstrap pin BST, and its drain terminal is coupled to the source terminal of the first P-type field effect transistor P11 and is configured to output the first-order shifting signal ON1, and its gate terminal is coupled to the source terminal of the second P-type field effect transistor P12. The source of the fourth P-type field effect transistor P14 is coupled to the bootstrap pin BST, its drain terminal is coupled to the source terminal of the second P-type field effect transistor P12, and its gate terminal is coupled to the source terminal of the first P-type field effect transistor P11.

In FIG. 5, the second-order shifting circuit 31b comprises a first N-type field effect transistor N21, a second N-type field effect transistor N22, a third N-type field effect transistor N23, and a first P-type field effect transistor P21. As shown in FIG. 5, the source terminal of the first P-type field effect transistor P21 is coupled to the bootstrap pin BST, and its gate terminal is configured to receive the first-order shifting signal ON1. The source terminal of the first N-type field effect transistor N11 is coupled to the output pin OUT, the drain terminal is coupled to the drain terminal of the first P-type field effect transistor P21 and the gate terminal is configured to receive a shifting control signal CTRL. The source terminal of the second N-type field effect transistor N22 is coupled to the reference ground, the gate terminal is configured to receive the shifting control signal CTRL, and the drain terminal is coupled to the driving pin G to output the driving signal GT. The source terminal of the third N-type field effect transistor N23 is coupled to the driving pin G, its drain terminal is coupled to the bootstrap pin BST, and its gate terminal is coupled to the drain terminal of the first P-type field effect transistor P21. Wherein when the control signal VON is at its logic low state, the shifting control signal CTRL is at its logic high state to turn on the first N-type field effect transistor N11 and the second N-type field effect transistor N12, and when the control signal VON is at the logic high state, the shifting control signal CTRL is at its logic low state to turn off the first N-type field effect transistor N11 and the second N-type field effect transistor N12.

It should be understand that the level shifting circuit 31 given in FIG. 5 is only for an exemplary illustration, any circuit that can generate the driving signal GT based on the control signal VON is suitable to the present invention.

With the driving circuit of the present invention, when the voltage at the output pin OUT is less than the isolation voltage, the voltage at the bootstrap pin is clamped at a preset voltage value (the preset voltage value is in a range from −2V and −0.2V), the voltage at the bootstrap pin does not follow the voltage at the output pin to a relative low negative voltage value (−100V for example). The driving circuit using the present invention can be fabricated by devices or processes having a relative low breakdown voltage, thus the cost of the driving circuit is significantly reduced.

The advantages of the various embodiments of the present invention are not confined to those described above. These and other advantages of the various embodiments of the present invention will become more apparent upon reading the whole detailed descriptions and studying the various Figs of the drawings.

From the foregoing, it will be appreciated that specific embodiments of the present invention have been described herein for purposes of illustration, but that various modifications may be made without deviating from the technology. Many of the elements of an embodiment may be combined with other embodiments in addition to or in lieu of the elements of the other embodiments. Accordingly, the present invention is not limited except as by the appended claims.

What is claimed is:

1. A driving circuit for a power transistor, comprising:
   a control pin, configured to receive a control signal;
   a driving pin, configured to provide a driving signal to control the power transistor, wherein the driving signal is generated based on the control signal;
   a bootstrap pin;
   a level shifting circuit, wherein the level shifting circuit is configured to generate the driving signal based on the control signal, and wherein the driving signal has a logic high state equaling to the voltage at the bootstrap pin, and a logic low state equaling to the voltage at an output pin; and
   a negative voltage isolation circuit, coupled between an isolation pin and the output pin, the negative voltage isolation circuit comprises an isolation device, wherein the isolation device has a first terminal coupled to the isolation pin, and a second terminal coupled to the output pin, and wherein when the voltage at the output pin is greater than an isolation voltage, the voltage at the isolation pin is equal to the voltage at the output pin, and when the voltage at the output pin is less than the isolation voltage, the voltage at the isolation pin is clamped at a preset voltage value, the preset voltage value is in a range from −2V to −0.2V.

2. The driving circuit of claim 1, wherein the isolation voltage is in a range from 0.3V to 2V.

3. The driving circuit of claim 1, wherein when the voltage at the output pin is greater than the isolation voltage, the isolation device is turned on, and when the voltage at the output pin is less than the isolation voltage, the isolation device is turned off.

4. The driving circuit of claim 1, wherein the isolation device comprises a P-type field effect transistor.

5. The driving circuit of claim 4, wherein the negative voltage isolation circuit further comprises:
   an isolation resistor, coupled between the source terminal and the gate terminal of the P-type field effect transistor;
   a zener diode, coupled between the source terminal and the gate terminal of the P-type field effect transistor; and
   a pull-down transistor, coupled between the gate terminal of the P-type field effect transistor and a reference ground.

6. The driving circuit of claim 5, wherein the pull-down transistor is an N-type field effect transistor.

7. The driving circuit of claim 1, wherein the control signal has a logic high state and a logic low state, and wherein the high state is in a range from 3V to 6V, and the logic low state is equal to the reference ground.

8. The driving circuit of claim 1, further comprises a bootstrap capacitor coupled between the bootstrap pin and the isolation pin.

9. The driving circuit of claim 1, wherein the power transistor comprises an N-type field effect transistor.

10. A switching circuit comprising:
- a power transistor, having a source terminal, a drain terminal and a gate terminal;
- an input pin, coupled to the source terminal of the power transistor;
- an output pin, coupled to the drain terminal of the power transistor;
- a control pin, configured to receive a control signal;
- a driving pin, coupled to the gate terminal of the power transistor and configured to provide a driving signal to control the power transistor, wherein the driving signal is generated based on the control signal;
- a bootstrap pin, coupled to a first terminal of a bootstrap capacitor;
- an isolation pin, coupled to a second terminal of the bootstrap capacitor; and
- a negative voltage isolation circuit, coupled between the isolation pin and the output pin, wherein when the voltage at the output pin is greater than the isolation voltage, the voltage at the isolation pin is equal to the voltage at the output pin, and when the voltage at the output pin is less than the isolation voltage, the voltage at the isolation pin is clamped at a preset voltage value, the preset voltage value is in a range from −2V to −0.2V;
- a level shifting circuit, wherein the level shifting circuit is configured to generate the driving signal based on the control signal, and wherein the driving signal has a logic high state equaling to the voltage at the bootstrap pin, and a logic low state equaling to the voltage at the output pin.

11. The driving circuit of claim 10, wherein the isolation voltage is in a range from 0.3V to 2V.

12. The driving circuit of claim 10, wherein the negative voltage isolation circuit comprises a P-type field effect transistor coupled between the isolation pin and the output pin.

13. The driving circuit of claim 12, wherein the negative voltage isolation circuit further comprises:
- an isolation resistor, coupled between the source terminal and gate terminal of the P-type field effect transistor;
- a zener diode, coupled between the source terminal and gate terminal of the P-type field effect transistor; and
- a pull-down transistor, coupled between the gate terminal of the P-type field effect transistor and a reference ground.

14. The driving circuit of claim 13, wherein the pull-down transistor is an N-type field effect transistor.

15. The driving circuit of claim 10, wherein the control signal has a logic high state in a range from 3V to 6V, and a logic low state equaling to the reference ground.

16. The driving circuit of claim 10, wherein the power transistor comprises an N-type field effect transistor.

17. A driving circuit for a power transistor, comprising:
- a control pin, configured to receive a control signal;
- a driving pin, configured to provide a driving signal to control the power transistor, wherein the driving signal is generated based on the control signal;
- a bootstrap pin;
- a level shifting circuit, wherein the level shifting circuit is configured to generate the driving signal based on the control signal, and wherein the driving signal has a logic high state equaling to the voltage at the bootstrap pin, and a logic low state equaling to the voltage at an output pin; and
- a negative voltage isolation circuit, coupled between an isolation pin and the output pin, the negative voltage isolation circuit comprises an isolation device, wherein the isolation device has a first terminal coupled to the isolation pin, and a second terminal coupled to the output pin, and wherein when the voltage at the output pin is greater than an isolation voltage, the voltage at the isolation pin is equal to the voltage at the output pin, and when the voltage at the output pin is less than the isolation voltage, the voltage at the isolation pin is clamped at a preset voltage value.

* * * * *